(12) United States Patent
Binshtok et al.

(10) Patent No.: US 12,035,473 B2
(45) Date of Patent: Jul. 9, 2024

(54) CIRCUIT ASSEMBLIES AND COMPONENTS THEREOF FOR PACKAGING

(71) Applicant: Westrock MWV, LLC, Atlanta, GA (US)

(72) Inventors: Ronald Binshtok, Quinton, VA (US); Carly J. Dehenau, Richmond, VA (US); James S. Shortt, Holly Springs, NC (US); Trisha Massenzo, Richmond, VA (US)

(73) Assignee: WestRock MWV, LLC, Atlanta, GA (US)

( * ) Notice: Subject to any disclaimer, the term of this patent is extended or adjusted under 35 U.S.C. 154(b) by 129 days.

(21) Appl. No.: 17/276,187

(22) PCT Filed: Sep. 17, 2019

(86) PCT No.: PCT/US2019/051454
§ 371 (c)(1),
(2) Date: Mar. 15, 2021

(87) PCT Pub. No.: WO2020/061006
PCT Pub. Date: Mar. 26, 2020

(65) Prior Publication Data
US 2022/0030717 A1    Jan. 27, 2022

Related U.S. Application Data

(60) Provisional application No. 62/732,067, filed on Sep. 17, 2018.

(51) Int. Cl.
*H05K 1/14*    (2006.01)
*A61J 1/03*    (2023.01)
(Continued)

(52) U.S. Cl.
CPC .............. *H05K 1/141* (2013.01); *A61J 1/035* (2013.01); *H05K 1/11* (2013.01); *H05K 3/365* (2013.01);
(Continued)

(58) Field of Classification Search
CPC .......... H05K 1/141; H05K 1/11; H05K 3/365; H05K 1/0293; H05K 2203/175; A61J 1/035; A61J 2200/30; A61J 1/16
See application file for complete search history.

(56) References Cited

U.S. PATENT DOCUMENTS 4,111,510 A  *  9/1978  Zurcher ................. H05K 3/365
                                                    439/493
4,742,183 A     5/1988  Soloway et al.
(Continued)

OTHER PUBLICATIONS

International Search Report dated Jan. 23, 2020 from corresponding International Patent Application No. PCT/US2019/051454, filed Sep. 17, 2019.
Written Opinion dated dated Jan. 23, 2020 from corresponding International Patent Application No. PCT/US2019/051454, filed Sep. 17, 2019.

*Primary Examiner* — Ishwarbhai B Patel
(74) *Attorney, Agent, or Firm* — Neil G. Cohen; Rohini K. Garg (57) ABSTRACT

A circuit assembly includes a flexible card having a main panel and an extension panel foldably connected along a fold line and a card circuit disposed on the flexible card and having one or more contact points disposed proximate the fold line, and a circuit board having one or more electrical contacts formed on a surface of the circuit board. The flexible card and the circuit board can be disposed in face-to-face contact with each contact point of the card circuit is in registry with a respective electrical contact of the circuit board, with the extension panel folded at the fold line (Continued)

over the circuit board. The assembly includes a clip disposed over the folded extension panel and main panel to apply a sandwiching force to secure the circuit board and the card circuit in electrical contact.

14 Claims, 5 Drawing Sheets

(51) Int. Cl.
  *H05K 1/11* (2006.01)
  *H05K 1/18* (2006.01)
  *H05K 3/36* (2006.01)
  *H05K 1/02* (2006.01)

(52) U.S. Cl.
  CPC .......... *A61J 2200/30* (2013.01); *H05K 1/028* (2013.01); *H05K 1/18* (2013.01)

(56) References Cited

U.S. PATENT DOCUMENTS

| | | |
|---|---|---|
| 5,340,640 A | 8/1994 | Bientz |
| 6,093,054 A * | 7/2000 | Merkle .................. H01R 12/62 |
| | | 439/493 |
| 6,244,462 B1 * | 6/2001 | Ehrensvard ............. A61J 1/035 |
| | | 221/25 |
| 6,699,730 B2 | 3/2004 | Kim et al. |
| 8,345,431 B2 | 1/2013 | Clayton et al. |
| 9,101,530 B2 * | 8/2015 | Wilson ...................... A61J 7/02 |
| 2006/0144747 A1 * | 7/2006 | Le ......................... A61J 7/0481 |
| | | 206/531 |
| 2017/0004284 A1 * | 1/2017 | Lesau .................. B65D 75/367 |

\* cited by examiner

CIRCUIT ASSEMBLIES AND COMPONENTS THEREOF FOR PACKAGING

CROSS-REFERENCE TO RELATED APPLICATIONS

This application claims priority to and the benefit of U.S. Provisional Application No. 62/732,067, filed Sep. 17, 2018, the entire contents of which are herein incorporated by reference in their entirety.

FIELD

This disclosure relates to circuit assemblies and components thereof for packaging (e.g., unit dose packaging systems (UDPSs)).

BACKGROUND

Child resistant unit dose packaging systems are well-known in which the user presses a button or tab on an outer sleeve to release a blister card from within the sleeve. Once the card is slid outwardly so the blisters are clear of the sleeve, a medication dose can be removed by pressing it from the blister. An example of such a UDPS, offered commercially by WestRock Company under the trademark DOSEPAK®, can be seen by reference to U.S. Pat. No. 6,047,829, which is incorporated herein by reference.

Such conventional methods and systems have generally been considered satisfactory for their intended purpose. However, there is still a need in the art for improved packaging. The present disclosure provides a solution for this need.

SUMMARY

A circuit assembly can include a flexible card having a main panel and an extension panel foldably connected along a fold line and a card circuit disposed on the flexible card and having one or more contact points disposed proximate the fold line. The circuit assembly can include a circuit board having one or more electrical contacts formed on a surface of the circuit board. The flexible card and the circuit board can be disposed in face-to-face contact such that the each contact point of the card circuit is in registry with a respective electrical contact of the circuit board. The extension panel can be folded at the fold line over the circuit board. The assembly can include a clip disposed over the folded extension panel and the main panel to apply a sandwiching force to circuit board between the folded extension panel and the main panel to secure the circuit board and the card circuit in electrical contact.

In certain embodiments, the card circuit can be a printed circuit trace printed on the flexible card. The contact points can be printed contact points, for example.

The card circuit can be disposed on main panel. The main panel can include one or more breakable portions defined in the main panel. Each breakable portion can be defined by a score line or breakaway material.

Each breakable portion can be configured to be in communication with a blister for containing an item on an opposite side of the flexible card. The card circuit can include breakable contacts disposed at each breakable portion of the main panel such that a state of each breakable portion of the main panel can be determined using the card circuit and the circuit board.

In certain embodiments the clip can be C-shaped. In certain embodiments, the clip can include one or more slots that have teeth to hold a fastener that when locked in place applies pressure at a location of the contact points. The clip can include a clip extension extending from the C-shaped clip. In certain embodiments, the clip extension can include a flange formed at an end thereof such that the folded extension panel can be inserted into the clip with the extension panel facing the clip extension and an outer edge of the extension panel can be locked into the flange, thereby securing the clip to the folded extension panel.

In accordance with at least one aspect of this disclosure, a unit dose packaging system can include a circuit assembly as disclosed herein (e.g., as described above) and an outer sleeve, the circuit assembly being placed within the sleeve. The unit dose packaging system can include at least one blister for containing medication secured to the main panel (e.g., on an opposite side of the main panel).

In accordance with at least one aspect of this disclosure, a method for installing a circuit board to a flexible card can include aligning one or more electrical contacts of a circuit board with one or more contact points of a card circuit disposed on the flexible card, and folding an extension panel of the flexible card over the circuit board to sandwich the circuit board between the extension panel and a main panel of the flexible card to contact the one or more electrical contacts of the circuit board with the one or more contact points of the card circuit. The method can include applying a clip to the extension panel and the main panel to apply a sandwiching force to circuit board between the folded extension panel and the main panel to secure the circuit board and the card circuit in electrical contact.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
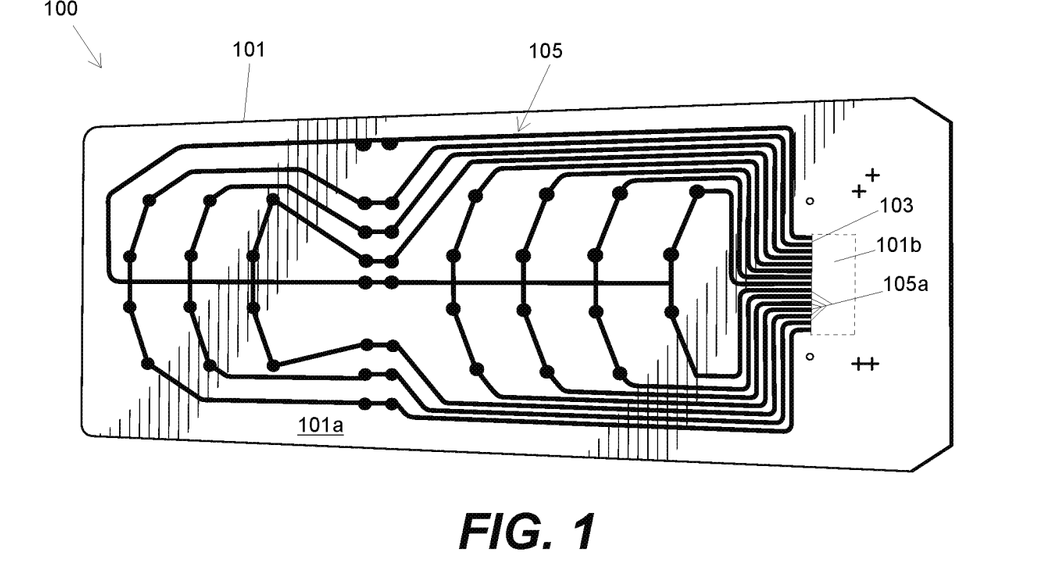
FIG. 1 is a perspective view of an embodiment of a flexible card (e.g., a UDPS package) in accordance with this disclosure, shown having a card circuit disposed thereon.

Reference will now be made to the drawings wherein like reference numerals identify similar structural features or aspects of the subject disclosure. For purposes of explanation and illustration, and not limitation, an illustrative view of a portion of an embodiment of an assembly in accordance with the disclosure is shown in FIG. 1 and is designated generally by reference character 100. Other embodiments and/or aspects of this disclosure are shown in FIGS. 2-8.

Referring to FIGS. 1-5 circuit assembly 100 can include a flexible card 101 having a main panel 101*a* and an extension panel 101*b* foldably connected to the main panel 101*a* along a fold line 103. The flexible card 101 can be made of any suitable material (e.g., a paperboard, plastic, etc.). The extension panel 101*b* can be formed by a cut or score lines on a plurality of sides (e.g., three sides that form a rectangle) to form a shape (e.g., a rectangle or any other suitable shape that fold about fold line 103) of the extension panel 101*b*.

The assembly 100 can include a card circuit 105 disposed on the flexible card 101 and having one or more contact points 105*a* disposed proximate the fold line 103. In certain embodiments, the card circuit 105 can be a printed circuit trace printed on the flexible card 101. The contact points 105*a* can be printed contact points, for example.

Figure 2:
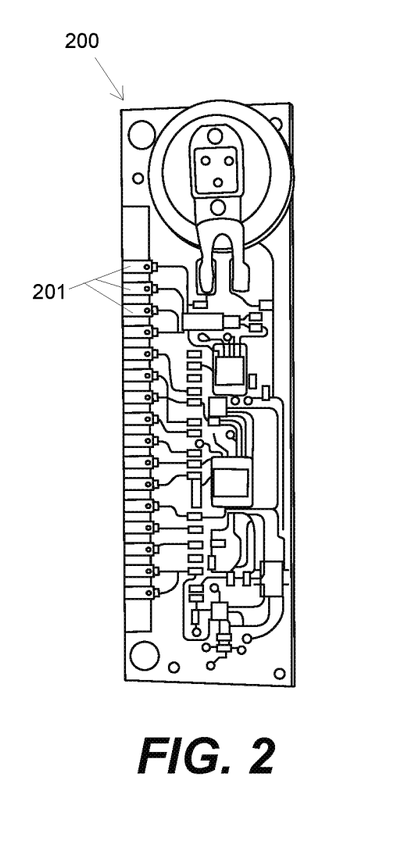
FIG. 2 is a perspective view of an embodiment of a circuit board in accordance with this disclosure.
Figure 3:
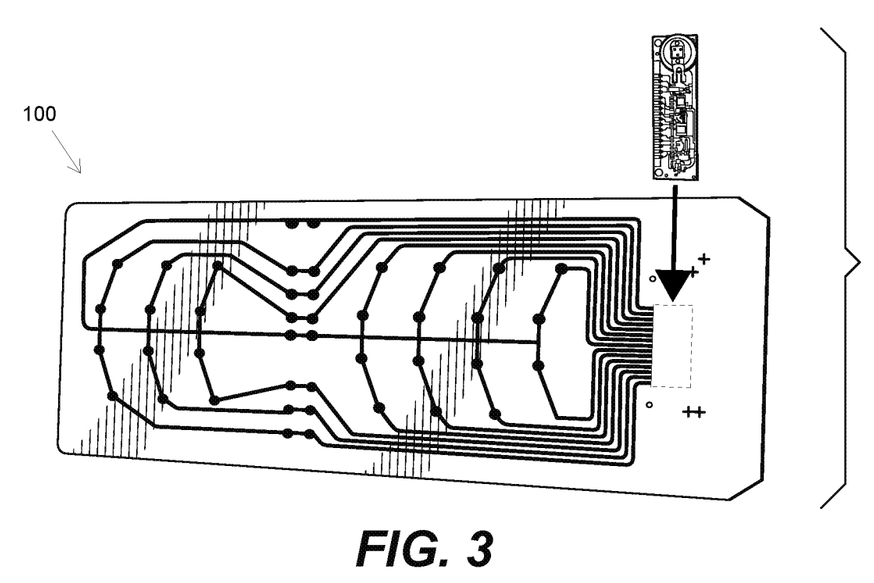
FIG. 3 is a schematic diagram showing the circuit board of FIG. 2 being placed in alignment with a plurality of printed contact points of the card circuit.
Figure 4:
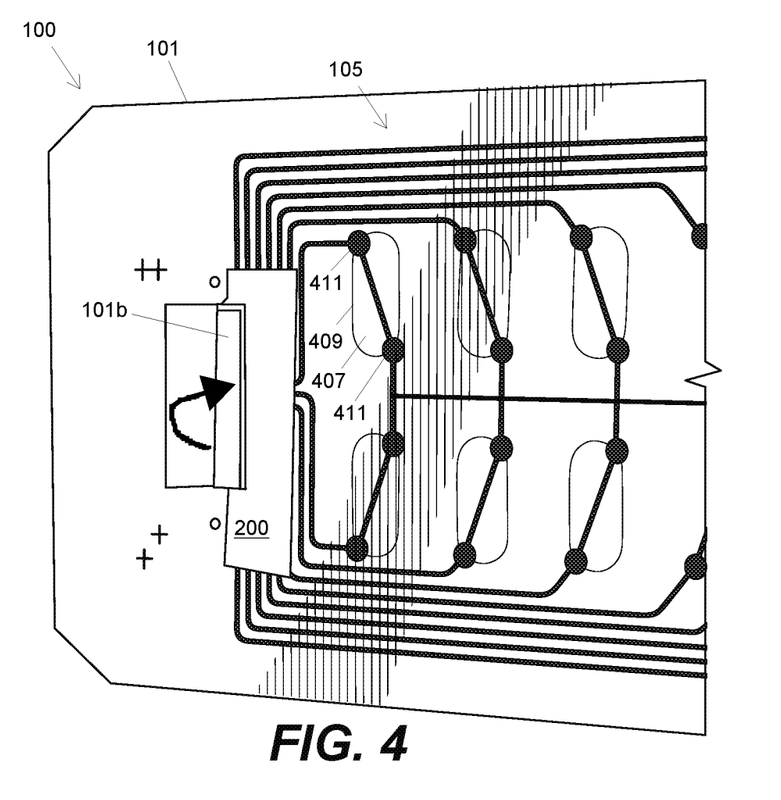
FIG. 4 is a schematic diagram showing an extension panel being folded over the circuit board of FIG. 3 to cause electrical contacts of the circuit board to be in contact with the plurality of printed contact points.

The circuit assembly 100 can include a circuit board 200, e.g., as shown in FIG. 2, having one or more electrical contacts 201 formed on a surface of the circuit board 200. As indicated in FIG. 3, the flexible card 101 and the circuit board 200 can be positioned to have each electrical contact 201 to be aligned with each contact point 105*a*. The flexible card 101 and the circuit board 200 can be disposed in face-to-face contact such that the each contact point 105*a* of the card circuit 105 is in registry with a respective electrical contact 201 of the circuit board 200. As shown in FIG. 4, the extension panel 101*b* can be folded at the fold line 103 over the circuit board 200.

The card circuit 105 can be disposed on main panel 101*a*, e.g., as shown in FIGS. 1-5. As shown best in FIGS. 4 and 5, the main panel 101*a* can include one or more breakable portions 407 defined in the main panel 101*a*. Each breakable portion 407 can be defined by a score line 409 or breakaway material, for example.

Figure 5:
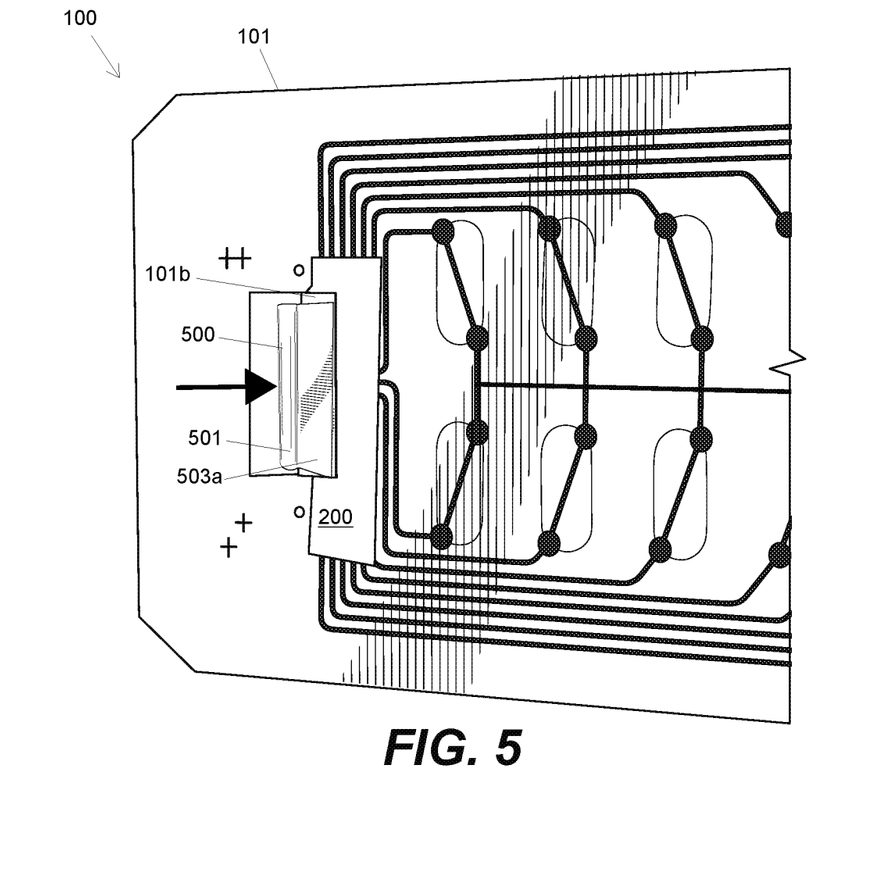
FIG. 5 is a partial perspective view of an embodiment of a circuit assembly in accordance with this disclosure, showing a clip installed over the extension panel to retain the circuit board electrical contacts to the plurality of printed contact points.

Each breakable portion 407 can be configured to be in communication with a blister (not shown) for containing an item (e.g., a pill) on an opposite side of the flexible card 101. The card circuit 105 can include one or more breakable contacts 411 disposed at each breakable portion 407 (e.g, along the score line 409) of the main panel 101*a* such that a state of each breakable portion 407 (e.g., whether the breakable portion is broken) of the main panel 101*a* can be determined using the card circuit 105 and the circuit board 200. The card circuit 105 can be any suitable circuit (e.g., have any suitable lines and/or circuit pattern) and can be configured to perform any suitable function (e.g., to allow logic on the circuit board 200 to determine if one or more breakable contacts 411 are broken to determine if a medication has been taken and/or to monitor medication use).

Figure 6:
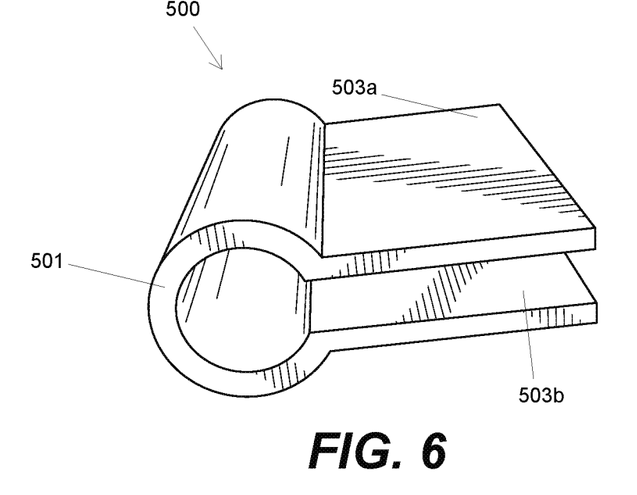
FIG. 6 is a perspective view of an embodiment of clip in accordance with this disclosure.

Referring to FIGS. 5 and 6, the assembly 100 can include a clip 500 disposed over the folded extension panel 101*b* and the main panel 101*a* to apply a sandwiching force to circuit board 200 between the folded extension panel 200 and the main panel 101*a* to secure the circuit board 200 and the card circuit 105 in electrical contact. The clip 500 can be made of any suitable material, e.g., plastic, metal, etc. The clip may be made from flexible metal or plastic or could be a rigid structure. In this latter case, pressure application may be provided and/or controlled either by screws or push plates that lock the flexible card 101 to the electronic circuit board 200. The locking mechanism can decrease the distance of the plates to hold the substrate in place.

In certain embodiments the clip 500 can be C-shaped (e.g., made of resilient material). For example, the clip 500 can include a C-shaped body 501 and a plurality of extensions 503*a*, 503*b* (e.g., having a planar shape) extending therefrom. The plurality of extensions 503*a*, 503*b* can include the same dimensions and/or shape, e.g., as shown. However, different dimensions and/or shape are contemplated herein. The texture of the top and bottom surface in contact with the flexible card can be patterned (e.g., or have general roughness) to allow gripping of the flexible card to the clip 500.

Figure 7:
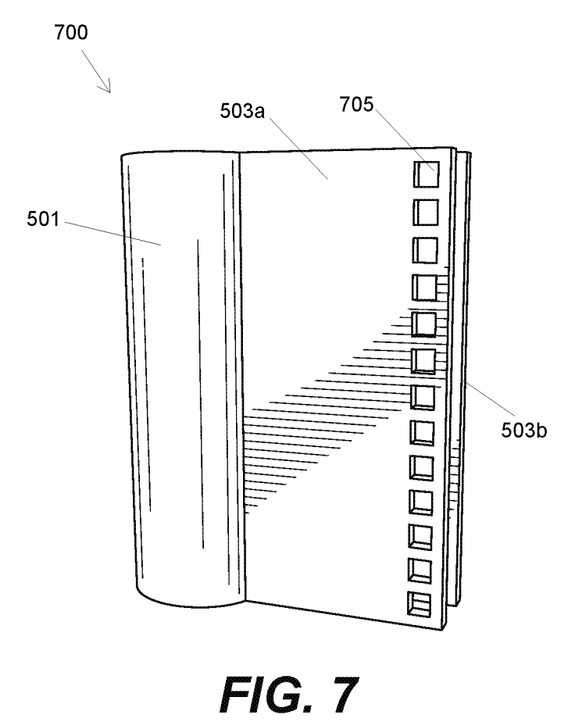
FIG. 7 is a perspective view of an embodiment of clip in accordance with this disclosure.

Referring to FIG. 7, in certain embodiments, the clip 700 can include one or more slots 705 (e.g., a plurality of slots 705 disposed in a row along an edge of extension 503*a*) that have teeth to hold a fastener (e.g., a push pin or metal) that when locked in place applies pressure at a location of the contact points 105*a*. Certain embodiments can include a C-shaped clip with holes for guide pins, or a clip with top and bottom portions having barbed pins so that once pressure is applied, the pins pierce the paperboard to lock everything in place to prevent sliding.

Figure 8:
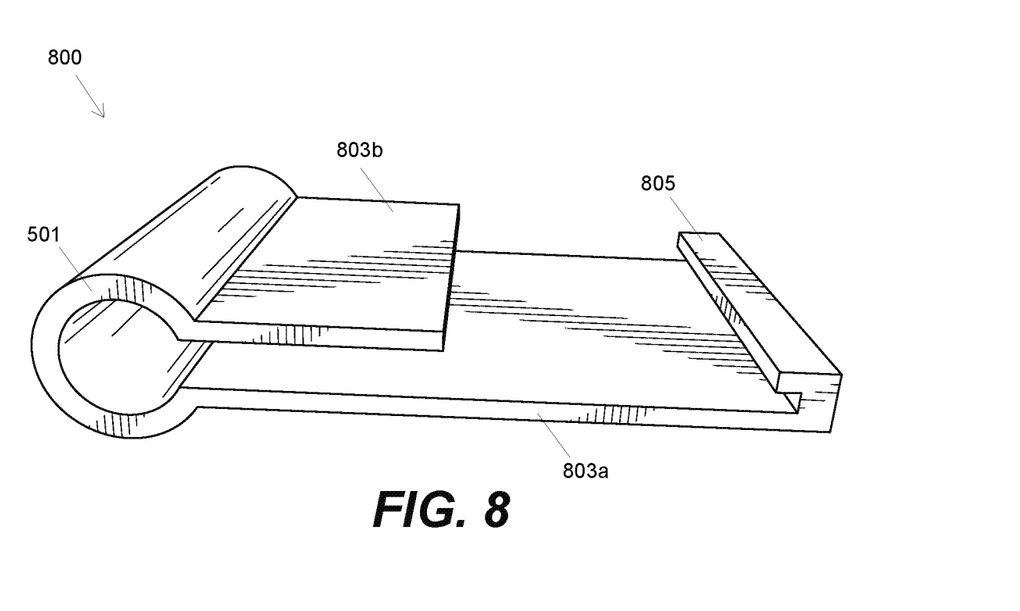
FIG. 8 is a perspective view of an embodiment of clip in accordance with this disclosure.

In certain embodiments, referring to FIG. 8, the clip 800 can include a clip extension 803*a* extending from the C-shaped body 501. In certain embodiments, the clip extension 503*a* can include a flange 805 formed at an end thereof such that the folded extension panel 101*b* can be inserted into the clip 800 with the extension panel 101*b* facing the clip extension 803*a* and an outer edge of the extension panel 101*b* (e.g., the edge furthest from the fold line 103) can be locked into the flange 805, thereby securing the clip 800 to the folded extension panel 101*b*. The flange 805 can include any suitable shape (e.g., a U-shape where the open part of the U faces back into the open part of the C-shaped body 501, e.g., as shown).

In accordance with at least one aspect of this disclosure, a unit dose packaging system (UDPS) can include a circuit assembly 100 as disclosed herein (e.g., as described above) and an outer sleeve, the circuit assembly 100 being placed within the sleeve. The unit dose packaging system UDPS can include at least one blister (not shown) for containing medication secured to the main panel 101*a* (e.g., on an opposite side of the main panel 101*a*). Any suitable blister packaging is contemplated herein.

In accordance with at least one aspect of this disclosure, a method for installing a circuit board to a flexible card can include aligning one or more electrical contacts of a circuit board with one or more contact points of a card circuit disposed on the flexible card, and folding an extension panel of the flexible card over the circuit board to sandwich the circuit board between the extension panel and a main panel of the flexible card to contact the one or more electrical contacts of the circuit board with the one or more contact points of the card circuit. The method can include applying a clip to the extension panel and the main panel to apply a sandwiching force to circuit board between the folded extension panel and the main panel to secure the circuit board and the card circuit in electrical contact.

In UDPS, because each dose is removed individually from the package, one can track such removal as a means of monitoring patient compliance with a prescribed medication regimen, for example, using certain embodiments. For example, one way this can be accomplished is to provide printed electronic traces using conductive ink on a blister card that forms breakable circuits, each broken by removal of a medication dose. By connecting the traces to an appropriate electronic circuit, the breaking of the circuits, and hence the removal of medication, may be monitored.

One practical problem is the connection of the conductive traces to the electronic circuit, which may be carried on a relatively small conventional circuit board. Because of the requirement for low cost and the mass-production environment in which such packaging is manufactured and filled, typical electrical connection means such as plug-and-socket devices or soldered connections are not practical. On the other hand, low cost solutions such as adhesive tapes are not sufficiently robust to withstand shipping and handling of the package through the distribution and retail chain.

Certain embodiments mechanically attach an electronic circuit board to a flexible substrate that has a printed electronic circuit on the surface. The contacts of the electronic circuit board can be connected to the open traces of the printed electronic circuit. Once the circuits are mechanically attached, the individual circuits can build a complete closed circuit, for example. One environment in which the embodiments may be used is a unit dose packaging system (UDPS), e.g., of the type shown in U.S. Pat. No. 6,047,829, incorporated by reference herein. As shown in FIGS. 7-11 of the referenced patent, the package includes an inner slide card carrying one or more blisters that hold individual doses of medication. The slide card is placed into an outer sleeve, from which it is slidingly withdrawn to remove medication. Child-resistant security can be provided by the combination of a folded extension panel connected to the slide card and a release push button formed on the outer surface of the sleeve. As explained in the referenced patent, pressing the release button unlocks the slide card from engagement with the sleeve, thereby enabling the slide card to be removed.

Embodiments can include a flexible card on which printed circuitry is applied. The card may be formed from any flat, flexible substrate, e.g., paperboard or plastic. Plastic blisters for holding medication doses can be attached to the reverse side of the card (not shown), e.g., in a conventional manner such as by heat-sealing to form the inner card for a UDPS. Embodiments of a card can also include an extension connected along a fold line at one end of the card. Approximately at the fold line, the printed traces end in a series of contact points, for example.

Embodiments can include an electronic circuit board that carries electronic circuitry and components and/or and suitable software module for detecting a break in the circuits formed on the card and storing and/or transmitting such information for medication compliance. The circuit board can include a series of contacts formed along one edge in a pattern corresponding to the contact points provided on the card. As shown in FIG. 4, the board can be positioned with its contacts in registration with the printed contact points, and may be temporarily secured, e.g., with tape. The card extension can then be folded over the circuit board so that the substrate material sandwiches the board.

A mechanical attachment in the form of a clip can then be placed onto the folded board to apply pressure to the flexible substrate and sandwiched circuit board, which is held together in position by the clip. This presses the board contacts against the printed contacts, allowing the electronic circuit board and printed flexible substrate to be both mechanically and electrically connected. Embodiments of a clip can include a structure formed to have a top flat portion and a bottom flat portion that provides compressive forces. Additionally, the texture of the top and bottom surface in contact with the flexible substrate can be patterned to allow gripping of the substrate to the clip. Any suitable clip is contemplated herein.

Embodiments are not limited to use with pharmaceutical packaging, and may be used for a variety of consumer-interactable electronics. Embodiments may be used in any commercial area in which a combination of printed electronics and a circuit board is needed, for example.

Embodiments include a number of advantages. For example, embodiments can secure mechanical bonding electronic circuit boards to flexible electronics such as paperboard with printed circuitry, allow bonding of circuits without the use of adhesives, and provide circuit boards that are reusable/recyclable after use. For healthcare applications, embodiments can provide an electronic module more easily removed for HIPAA compliance. Embodiments can allow maintaining of electrical connection while pressure is applied. Embodiments are applicable to a wide range of flexible substrates that may or may not be compatible with adhesives depending on surface properties, e.g., waxy surfaces and adhesive-resistant polymers. Embodiments can provide doubling of the available area for conductive attachment by sandwiching the flexible substrate around the electronic board, for example.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A circuit assembly, comprising:
   a flexible card having a main panel and an extension panel foldably connected along a fold line;
   a card circuit disposed solely on the main panel of the flexible card and having one or more contact points disposed proximate the fold line;
   a circuit board having one or more electrical contacts formed on a surface of the circuit board, wherein the flexible card and the circuit board are in face-to-face contact such that the each contact point of the card circuit is in registry with a respective electrical contact of the circuit board, wherein the extension panel is folded at the fold line over the circuit board; and
   a clip disposed over the folded extension panel and the main panel to apply a sandwiching force to the circuit board between the folded extension panel and the main panel to secure the circuit board and the card circuit in electrical contact.

2. The assembly of claim 1, wherein the card circuit can be a printed circuit trace printed on the flexible card.

3. The assembly of claim 2, wherein the contact points can be printed contact points.

4. The assembly of claim 1, wherein the card circuit is disposed on main panel.

5. The assembly of claim 1, wherein the main panel includes one or more breakable portions defined in the main panel.

6. The assembly of claim 5, wherein each breakable portion is defined by a score line or breakaway material.

7. The assembly of claim 5, wherein each breakable portion is configured to be in communication with a blister for containing an item on an opposite side of the flexible card.

8. The assembly of claim 5, wherein the card circuit includes breakable contacts disposed at each breakable portion of the main panel such that a state of each breakable portion of the main panel can be determined using the card circuit and the circuit board.

9. The assembly of claim 5, wherein the clip is C-shaped.

10. The assembly of claim 9, wherein the clip includes one or more slots that have teeth to hold a fastener that when locked in place applies pressure at a location of the contact points.

11. The assembly of claim 9, wherein the clip includes a clip extension extending from the C-shaped clip. The clip extension including a flange formed at an end thereof such that the folded extension panel can be inserted into the clip with the extension panel facing the clip extension and an outer edge of the extension panel can be locked into the flange, thereby securing the clip to the folded extension panel.

12. The assembly of claim 1 wherein the flexible card is formed from one of a paperboard or plastic.

13. A unit dose packaging system, comprising: a circuit assembly in accordance with claim 1; and an outer sleeve, the circuit assembly being placed within the sleeve.

14. A method for installing a circuit board to a flexible card, wherein the flexible card having a main panel and an extension panel, the method comprising:
   disposing a card circuit solely on the main panel of the flexible card;
   aligning one or more electrical contacts of the circuit board with one or more contact points of the card circuit disposed on the main panel of the flexible card, wherein a fold line is provided on the flexible card;
   folding an extension panel of the flexible card at the fold line over the circuit board to sandwich the circuit board between the extension panel and a main panel of the flexible card to contact the one or more electrical contacts of the circuit board with the one or more contact points of the card circuit; and
   applying a clip to the extension panel and the main panel to apply a sandwiching force to circuit board between the folded extension panel and the main panel to secure the circuit board and the card circuit in electrical contact.

* * * * *